United States Patent [19]

Hwang et al.

[11] Patent Number: 5,705,232
[45] Date of Patent: Jan. 6, 1998

[54] IN-SITU COAT, BAKE AND CURE OF DIELECTRIC MATERIAL PROCESSING SYSTEM FOR SEMICONDUCTOR MANUFACTURING

[75] Inventors: Ming Hwang, Richardson, Tex.; Toyotaro Horiuchi, Tokyo, Japan; Peter Ying, Plano; Jing Shu, Richardson, both of Tex.

[73] Assignee: Texas Instruments Incorporated, Dallas, Tex.

[21] Appl. No.: 309,220

[22] Filed: Sep. 20, 1994

[51] Int. Cl.$^6$ .................. C08J 7/04; B05D 3/12
[52] U.S. Cl. .......... 427/512; 427/240; 427/385.5; 427/498; 427/508; 427/521; 427/542; 437/231
[58] Field of Search ................ 427/240, 508, 427/226, 385.5, 542, 498, 512; 437/521, 231

[56] References Cited

U.S. PATENT DOCUMENTS

| | | | |
|---|---|---|---|
| 4,534,816 | 8/1985 | Chen et al. | 156/643 |
| 4,826,709 | 5/1989 | Ryan | 427/240 |
| 4,871,417 | 10/1989 | Nishizawa et al. | 134/1 |
| 4,913,790 | 4/1990 | Narita et al. | 204/192.13 |
| 4,957,777 | 9/1990 | Ilderem et al. | 427/55 |
| 5,006,370 | 4/1991 | Eisenbaum et al. | 427/240 |
| 5,098,198 | 3/1992 | Nulman et al. | 374/121 |
| 5,238,878 | 8/1993 | Shinohara | 427/240 |
| 5,246,728 | 9/1993 | Rodriquez | 427/240 |
| 5,276,126 | 1/1994 | Rogler | 427/240 |
| 5,376,408 | 12/1994 | Lippert | 427/162 |
| 5,444,217 | 8/1995 | Moore et al. | 219/405 |

*Primary Examiner*—Janyce Bell
*Attorney, Agent, or Firm*—David Denker; James C. Kesterson; Richard L. Donaldson

[57] ABSTRACT

This is a system and method of in-situ coating, baking and curing of dielectric material. The system may include: dispensing apparatus for dispensing spin-on material; a lamp module 50; a window 54 connected to the lamp module 50; an environmental control chamber 56 connected to the window 54; an access gate 60 for wafers 58 in the environmental control chamber 56; a spin chuck 62 inside the environmental control chamber 56; and an exhaust pipe 64 connected to the environmental control chamber 56. The lamp module 50 may contains infra red and ultra violet lamps. In addition, the coating chamber may process dielectric material such as spin-on glass, silicon dioxide and various other spin-on material.

14 Claims, 1 Drawing Sheet

IN-SITU COAT, BAKE AND CURE OF DIELECTRIC MATERIAL PROCESSING SYSTEM FOR SEMICONDUCTOR MANUFACTURING

CROSS-REFERENCE TO RELATED APPLICATION

The following coassigned patent application is hereby incorporated herein by reference:

| Serial No. | Filing Date | TI Case No. |
|---|---|---|
| 08/230,353 | 04/20/94 | TI-18897 |
| 08/251,558 | 05/31/94 | TI-19174 |

FIELD OF THE INVENTION

This invention relates to semiconductor device manufacturing, and specifically to dielectric material processing.

BACKGROUND OF THE INVENTION

Semiconductors are widely used in integrated circuits for electronic applications, including computers and televisions. Many integrated circuits now contain multiple levels of metallization for interconnections. A single semiconductor microchip may have thousands, and even millions of transistors. Logically, a single microchip may also have millions of lines interconnecting the transistors. These lines create a potential for electrical capacitance to gather in between the lines. As device geometries shrink and functional density increases, it becomes imperative to reduce the capacitance between the lines. If line-to-line capacitance builds up, a potential for electrical inefficiencies and inaccuracies exist. Reducing the RC time constant within these multi-level metallization systems will reduce the capacitance between the lines.

A method of reducing the RC time constant within these multi-level systems is the utilization of low-k dielectric materials in the fibrication process. Conventional semiconductor fabrication uses silicon dioxide or similar insulating materials as both a gap filler between adjacent conductors at the same level and as an interlayer insulator. Silicon dioxide has a dielectric constant of about 3.9. This constant is based on a scale where 1.0 represents the dielectric constant of a vacuum. Various materials exhibit dielectric constants from very near 1.0 to values in the hundreds. As used herein, the term low-k will refer to a material with a dielectric constant less than 3.9.

Polymeric spin-on glass, polyimide, and various spin-on materials have been used in multilevel interconnect fabrication processes. The applications of these materials include low-k interlevel dielectric, dielectric gap fill, and planarization. The conventional semiconductor manufacturing utilizes standalone (off-line) coaters, furnaces, scrubbers, plasma etchers and ashers to process dielectric material. These standalone processes produce long cycle time, high cost of ownership, and high amounts of defects.

SUMMARY OF THE INVENTION

The present invention solves the above cited problems. In particular, the present invention integrates optical curing modules (atmosphere control and/or vacuumed), and coaters into a single chamber system to perform in-line dielectric material coating, optical baking, and pre-etchback optical curing.

The present invention will significantly reduce cycle time, cost of ownership and the shop space required by the conventional approach. The present invention will also improve the yield for semiconductor device manufacturing due to the reduction in handling, the use of optical curing, and the cleanup processes.

This is a system and method of in-situ coating, baking and curing of dielectric material. The system may include: dispensing apparatus for dispensing spin-on material; a lamp module; a window connected to the lamp module; an environmental control chamber connected to the window; an access gate for wafers in the environmental control chamber; a spin chuck inside the environmental control chamber; and an exhaust pipe connected to the environmental control chamber. The lamp module may contains infra red and ultra violet lamps. In addition, the coating chamber may process dielectric material such as spin-on glass, silicon dioxide and various other spin-on material.

BRIEF DESCRIPTION OF THE DRAWINGS

This invention can be best understood by reference to the following drawing(s), in which.

DESCRIPTION OF THE PREFERRED EMBODIMENTS

Figure 1:
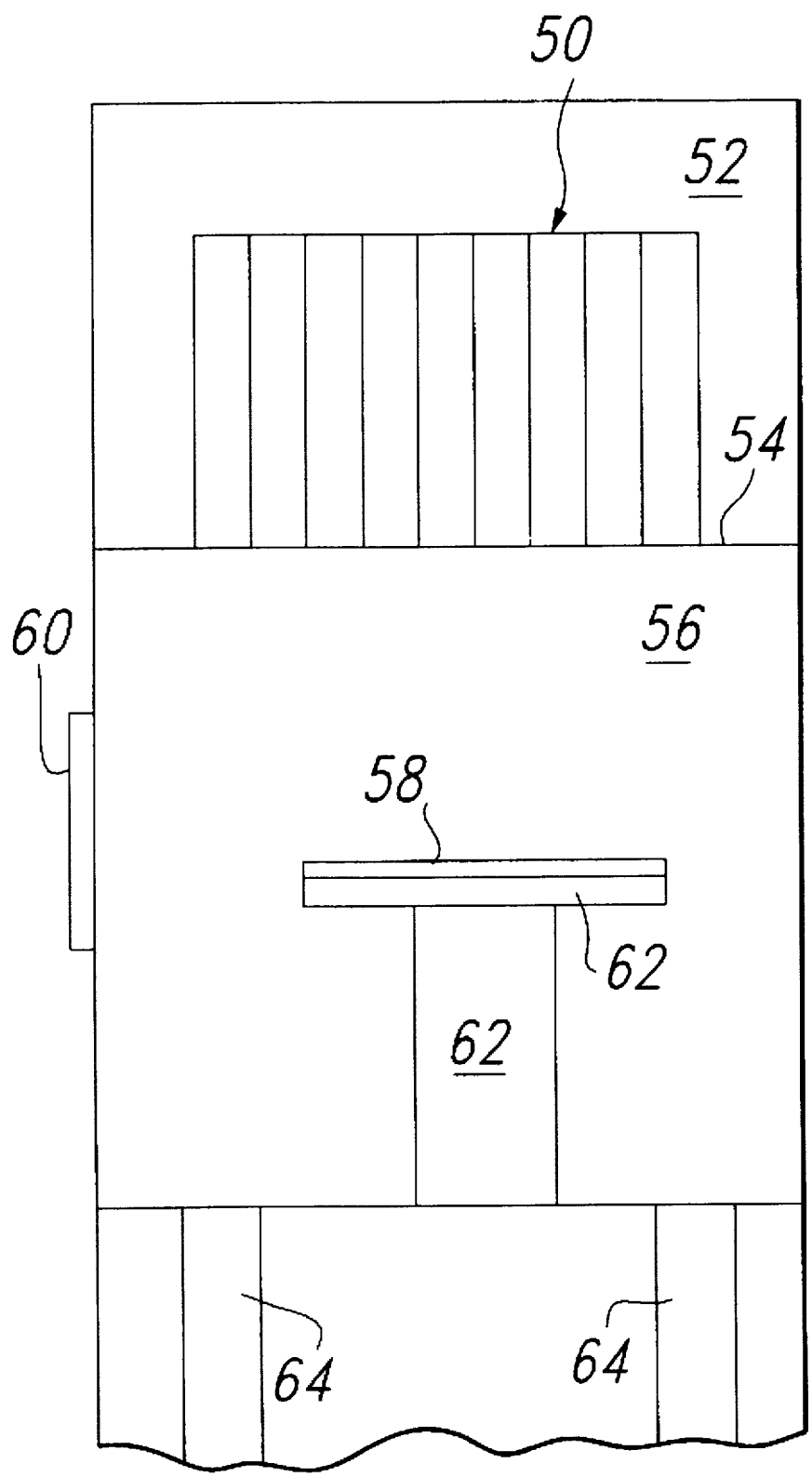
FIG. 1 is a cross section of the coating, curing and baking chamber.

The present invention is described in relation to the preferred embodiment detailed in FIG. 1. FIG. 1 depicts the system components of the preferred embodiment. The embodiment includes an environment control chamber 56 used for coating, curing and baking spin-on material. In addition, a lamp module 50 is also shown above the chamber. A wafer 58 will access the processing chamber through an access gate 60. A window (e.g. glass) may separate the lamp module 50 from the processing chamber 56. The housing unit 52 not only contains the lamp module 50, but also the requisite equipment to dispense spin-on material on the wafer 58. In addition, once the wafer is in the processing chamber, it sits on the spin chuck 62. Moreover, the exhaust pipes 64 are below the spin chuck 62. Each element will be discussed in detail below.

The lamp module 50 is utilized for optical curing. The optical curing uses heat sources of various wavelengths to cure low-k dielectrics and protective overcoats at lower temperatures, faster cycle times and lower scrap rates than the conventional furnace processes. For example, it takes 10 hours to cure 150 wafers of 16 megabit DRAM at polyimide protective coat at a conventional wafer fabrication facility. When the furnace malfunctions, the entire 150 wafers must be scraped. However, by using tungsten-halogen lamps and single wafer processing equipment, reduction in cycle time and scrap is expected, due to the photo-enhanced curing effect. Optical curing can also apply conventional interlevel dielectrics processing, such as curing of polymeric spin-on glass (e.g. organic containing spin-on glass).

Optical curing of low-k dielectric material in a semiconductor device may comprise: depositing metal interconnection lines; depositing the low-k dielectric material layer over the lines; and optically curing the low-k dielectric material layer with a heating lamp for less than 10 minutes, wherein the heating lamp provides optical radiation energy in the infrared spectral range of about 1 micron to 3.5 microns in wavelength. For greater detail, the cross referenced application TI-18897, Ser. No. 08/230,353, filed on Apr. 20, 1994, provides specifics of utilizing optical curing for dielectric material processing.

In addition, the lamp module 50 may be made up of only tungsten halogen lamps, only mercury lamps or intermixed to comprise a multi-type lamp module which could be tuned for process control. In addition, other types of infra red (IR) or ultra violet (UV) lamps may be interchanged with the tungsten halogen and mercury lamps. For example, sodium iodine lamps could replace the tungsten halogen lamps. The UV lamps are used for cross linking (photo polymization) and the IR lamps are used for heating (thermal polymization). Other lamps may be used for both cross linking and heating, such as visual or near IR lamps including tungsten halogen lamps.

In FIG. 1, the lamp module 50 and the wafer 56 are separated by a window 54. The window may be quartz or some other type of material depending on the whether filtration of wavelengths is required.

The wafer 58 sits on top of a spin chuck 62. The spin chuck 62 may include embedded thermocouples for temperature control. The spin chuck 62 may also be used as a hot plate with temperature control. Ideally, the spin chuck 62 would have a speed control and made of a low conductive material (e.g. Teflon) in order to be resistant to high temperatures. The spin chuck 62 could also be capable of producing a backside rinse. Additionally, the spin chuck may include wafer shelves and thermocouples similar in design to the wafer holder described in cross-referenced application TI-19174, Ser. No. 08/251,558, filed on May 31, 1994.

The environmental control chamber 56 includes ambient, pressure and gas flow control. Furthermore, the wafer enters the chamber 56 at gate 60. Of course, variations and modifications to the chamber will become obvious to persons skilled in the art and still remain in the spirit of the invention.

Furthermore, the exhaust pipes 64 are used to purge/exhaust clean gas (such as nitrogen) from the chamber to remove outgassing. However, the chamber may be designed as small as possible.

Additionally, the temperature may be mapped controlled by the use of the thermocouples on the spin chuck 80. Preferably, the thermocouples contact the wafer on its backside. With this design, the wafer's temperature may be measured inexpensively and efficiently. Additionally, optical pyrometers may be used to increase measurement points for superior temperature control.

The processing system could be used like a standard coater to dispense spin-on material. The system could also provide a low spin for uniform coverage. The spin-on material could then go through a spin and dry process by revolving the spin chuck 62. The spin and dry process would provide a constant uniform thickness and would help the drying process. After the material is at the desired thickness, the lamp module could be turned on to dry and/or cure the spin-on material. This process could be repeated for as many spin-on material layers as desired. In addition, the same material may be repeated in order to process the same material in a incremental format.

In addition, the processing chamber of the present invention could be incorporated into the system described in cross-referenced application TI-19174, Ser. No. 08/251,558, filed on May 31, 1994. Furthermore, the processing chamber of the present invention could also be used for any spin-on material and would be specifically useful for spin-on material that is particularly adaptive to optical curing, such as low-k dielectric material.

The invention is not to be construed as limited to the particular examples described herein, as these are to be regarded as illustrative, rather than restrictive. The invention is intended to cover all processes for various material layers which do not depart from the spirit and scope of the invention. Other modifications and combinations will be apparent to those skilled in the art. It is therefore intended that the appended claims encompass any such modifications or embodiments.

We claim:

1. A method of processing spin-on material within a single chamber, said method comprising:

coating a curable spin-on material on a semiconductor wafer;

spinning said spin-on material, wherein said spinning provides a uniform thickness and dries said spin-on material; and curing said spin-on material.

2. The method of claim 1, wherein said coating spin-on material includes spinning-on low dielectric material.

3. The method of claim 1, wherein said coating spin-on material includes spinning-on polymeric spin-on glass.

4. The method of claim 1, wherein said coating spin-on material includes spinning-on polyimide.

5. The method of claim 1, wherein said coating spin-on material includes spinning-on silicon dioxide.

6. The method of claim 1, wherein said coating spin-on material includes coating organic compounds.

7. The method of claim 1, wherein said method includes single wafer processing.

8. The method of claim 1, wherein said method further includes single wafer processing in an assembly line process including other processing of said wafer.

9. The method of claim 1, whereto said method further includes depositing a protective layer over said spin-on material before said curing.

10. The method of claim 1, wherein said method further includes depositing a low dielectric material over said spin-on material before said curing.

11. The method of claim 1, wherein said curing includes curing said dielectric material with a heating lamp for less than 10 minutes, wherein said heating lamp provides optical radiation energy.

12. The method of claim 11, wherein said optical radiation energy includes an infrared spectral range of about 1 micron to 3.5 microns in wavelength.

13. The method of claim 1, wherein said curing of said spin-on material is done by a tungsten-halogen lamp.

14. The method of claim 1, wherein curing of said spin-on material includes curing a polyimide and said curing time is less than 5 minutes.

* * * * *